(12) United States Patent
Chen et al.

(10) Patent No.: US 11,916,077 B2
(45) Date of Patent: Feb. 27, 2024

(54) METHOD FOR ROUTING LOCAL INTERCONNECT STRUCTURE AT SAME LEVEL AS REFERENCE METAL LINE

(71) Applicant: Taiwan Semiconductor Manufacturing Co., Ltd., Hsinchu (TW)

(72) Inventors: Chih-Liang Chen, Hsinchu (TW); Cheng-Chi Chuang, New Taipei (TW); Chih-Ming Lai, Hsinchu (TW); Chia-Tien Wu, Taichung (TW); Charles Chew-Yuen Young, Cupertino, CA (US); Hui-Ting Yang, Zhubei (TW); Jiann-Tyng Tzeng, Hsinchu (TW); Ru-Gun Liu, Zhubei (TW); Wei-Cheng Lin, Taichung (TW); Lei-Chun Chou, Taipei (TW); Wei-An Lai, Hsinchu (TW)

(73) Assignee: Taiwan Semiconductor Manufacturing Co., Ltd., Hsinchu (TW)

( * ) Notice: Subject to any disclaimer, the term of this patent is extended or adjusted under 35 U.S.C. 154(b) by 249 days.

(21) Appl. No.: 17/328,534

(22) Filed: May 24, 2021

(65) Prior Publication Data

US 2021/0280607 A1    Sep. 9, 2021

Related U.S. Application Data

(62) Division of application No. 16/022,821, filed on Jun. 29, 2018, now Pat. No. 11,018,157.

(Continued)

(51) Int. Cl.
*H01L 27/118*    (2006.01)
*H01L 27/092*    (2006.01)
(Continued)

(52) U.S. Cl.
CPC .............. *H01L 27/11807* (2013.01); *H01L 21/823821* (2013.01); *H01L 21/823871* (2013.01);
(Continued)

(58) Field of Classification Search
CPC .......... H01L 27/11807; H01L 27/0207; H01L 27/0924; H01L 21/823821;
(Continued)

(56) References Cited

U.S. PATENT DOCUMENTS

| | | | |
|---|---|---|---|
| 5,747,849 | A | 5/1998 | Kuroda et al. |
| 6,100,588 | A | 8/2000 | McAdams et al. |

(Continued)

FOREIGN PATENT DOCUMENTS

| | | |
|---|---|---|
| CN | 102355217 A | 2/2012 |
| CN | 105513628 A | 4/2016 |

(Continued)

*Primary Examiner* — Lex H Malsawma
(74) *Attorney, Agent, or Firm* — Sterne, Kessler, Goldstein & Fox P.L.L.C

(57) ABSTRACT

The present disclosure describes an apparatus with a local interconnect structure. The apparatus can include a first transistor, a second transistor, a first interconnect structure, a second interconnect structure, and a third interconnect structure. The local interconnect structure can be coupled to gate terminals of the first and second transistors and routed at a same interconnect level as reference metal lines coupled to ground and a power supply voltage. The first interconnect structure can be coupled to a source/drain terminal of the first transistor and routed above the local interconnect structure. The second interconnect structure can be coupled to a source/drain terminal of the second transistor and routed above the local interconnect structure. The third interconnect structure can be routed above the local interconnect
(Continued)

structure and at a same interconnect level as the first and second interconnect structures.

20 Claims, 14 Drawing Sheets

Related U.S. Application Data

(60) Provisional application No. 62/564,688, filed on Sep. 28, 2017.

(51) Int. Cl.
*H01L 23/522* (2006.01)
*H01L 21/8238* (2006.01)
*H01L 27/02* (2006.01)
*H01L 23/528* (2006.01)
*H01L 23/532* (2006.01)

(52) U.S. Cl.
CPC ...... *H01L 23/5226* (2013.01); *H01L 27/0207* (2013.01); *H01L 27/0924* (2013.01); *H01L 23/5286* (2013.01); *H01L 23/53209* (2013.01); *H01L 23/53228* (2013.01); *H01L 23/53242* (2013.01); *H01L 2027/11875* (2013.01); *H01L 2027/11881* (2013.01); *H01L 2027/11888* (2013.01)

(58) Field of Classification Search
CPC ......... H01L 21/823871; H01L 23/5226; H01L 23/5286; H01L 23/53209; H01L 23/53228; H01L 23/53242; H01L 2027/11875; H01L 2027/11881; H01L 2027/11888

See application file for complete search history.

(56) References Cited

U.S. PATENT DOCUMENTS

| 6,525,350 | B1 | 2/2003 | Kinoshita |
| 8,624,683 | B2 | 1/2014 | Hirota |
| 9,570,395 | B1 | 2/2017 | Sengupta et al. |
| 9,583,438 | B2 | 2/2017 | Liaw et al. |
| 9,627,316 | B1 | 4/2017 | Chang et al. |
| 9,704,564 | B2 | 7/2017 | Liaw |
| 9,793,211 | B2 | 8/2017 | Peng et al. |
| 2009/0108360 | A1 | 4/2009 | Smayling |
| 2011/0303958 | A1 | 12/2011 | Matsuo et al. |
| 2013/0099852 | A1 | 4/2013 | Chen et al. |
| 2016/0027499 | A1 | 1/2016 | Liaw |
| 2016/0049395 | A1 | 2/2016 | Okagaki |
| 2016/0172351 | A1 | 6/2016 | Shimbo |
| 2016/0197082 | A1 | 7/2016 | Park et al. |
| 2017/0110181 | A1* | 4/2017 | Fujiwara ............... G11C 8/14 |
| 2017/0154848 | A1* | 6/2017 | Fan ............. H01L 21/823425 |
| 2017/0162581 | A1* | 6/2017 | Lai ..................... H10B 10/12 |
| 2017/0177779 | A1 | 6/2017 | Smayling |
| 2018/0350743 | A1 | 12/2018 | Fan et al. |

FOREIGN PATENT DOCUMENTS

| JP | H06196711 A | 7/1994 |
| JP | H1065125 A | 3/1998 |
| KR | 20100077986 A | 7/2010 |
| KR | 20160079710 A | 7/2016 |
| KR | 20170057820 A | 5/2017 |
| KR | 20170063358 A | 6/2017 |
| TW | 201640568 A | 11/2016 |
| TW | 201715684 A | 5/2017 |
| TW | 201731057 A | 9/2017 |
| TW | 201733002 A | 9/2017 |

* cited by examiner

METHOD FOR ROUTING LOCAL INTERCONNECT STRUCTURE AT SAME LEVEL AS REFERENCE METAL LINE

CROSS-REFERENCE TO RELATED APPLICATION

This application is a divisional of U.S. patent application Ser. No. 16/022,821, titled "Local Interconnect Structure" and filed on Jun. 29, 2018, which claims the benefit of U.S. Provisional Patent Application No. 62/564,688, titled "Local Interconnect Structure" and filed on Sep. 28, 2017, both of which are incorporated herein by reference in their entireties.

BACKGROUND

The semiconductor integrated circuit (IC) industry has experienced exponential growth. Technological advances in IC materials and design have produced generations of ICs, where each generation has smaller and more complex circuits than the previous generation. In the course of IC evolution, functional density (e.g., the number of interconnected devices per chip area) has generally increased while geometry size (e.g., the smallest component or line that can be created using a fabrication process) has decreased. As IC scaling continues, more devices are connected and the switching speed of the devices increases, thus requiring advancements in wiring interconnect structures to achieve IC performance goals.

BRIEF DESCRIPTION OF THE DRAWINGS

Aspects of the present disclosure are best understood from the following detailed description when read with the accompanying figures. It is noted that, in accordance with the common practice in the industry, various features are not drawn to scale. In fact, the dimensions of the various features may be arbitrarily increased or reduced for clarity of illustration and discussion.

DETAILED DESCRIPTION

Figure 1:
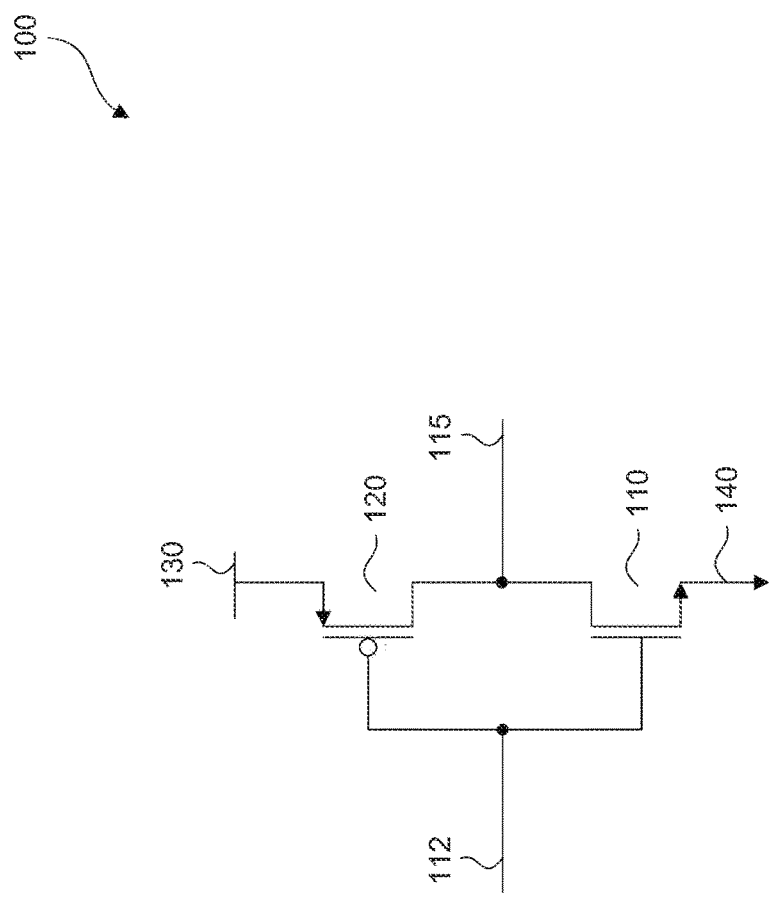
FIGS. 1 and 2 are illustrations of a circuit representation of an inverter device, according to some embodiments.

The following disclosure provides many different embodiments, or examples, for implementing different features of the provided subject matter. Specific examples of components and arrangements are described below to simplify the present disclosure. These are merely examples and are not intended to be limiting. In addition, the present disclosure repeats reference numerals and/or letters in the various examples. This repetition is for the purpose of simplicity and clarity and, unless indicated otherwise, does not in itself dictate a relationship between the various embodiments and/or configurations discussed.

The present disclosure describes routing a local interconnect structure to one or more gate terminals, one or more drain terminals, and/or one or more source terminals of a transistor device (e.g., finFET devices, double-gate devices, tri-gate devices, omega FETs, and gate all around devices). A benefit, among others, of routing the local interconnect structure to the gate, drain, and/or source terminals is to reduce one or more parasitic capacitances in an interconnect level (e.g., in an M0 interconnect level). By routing to these terminals using the local interconnect structure, a length dimension of an interconnect in the interconnect level can be shortened or minimized. This shortened or minimum interconnect length reduces parasitic capacitances present at the interconnect level, thus improving device performance.

FIG. 1 is an illustration of a circuit representation of an inverter device 100, according to some embodiments. Inverter device 100 includes an n-type transistor 110 and a p-type transistor 120. Gate terminals of n-type 110 and p-type transistor 120 are electrically connected to one another at an input terminal 112. Drain terminals of n-type and p-type transistors 110 and 120 are electrically connected to one another at an output terminal 115. A source terminal of p-type transistor 120 is electrically connected to a power supply voltage 130. Examples of the power supply voltage can be 0.5V, 0.7V, 1.2V, 1.8V, 2.4V, 3.3V, or 5V. A person of ordinary skill in the art will recognize that other power supply voltages may be used based on the description herein. A source terminal of n-type transistor 110 is electrically connected to ground 140 (e.g., 0V). A logic high voltage (e.g., power supply voltage 130) at input terminal 112 results in a logic low voltage (e.g., 0V) at output terminal 115—and vice versa. Gate terminals are also referred to herein as "gate." Also, source terminals and drain terminals are also referred to herein as "source/drain" (S/D) or "source/drain terminals" (S/D terminals).

Figure 2:
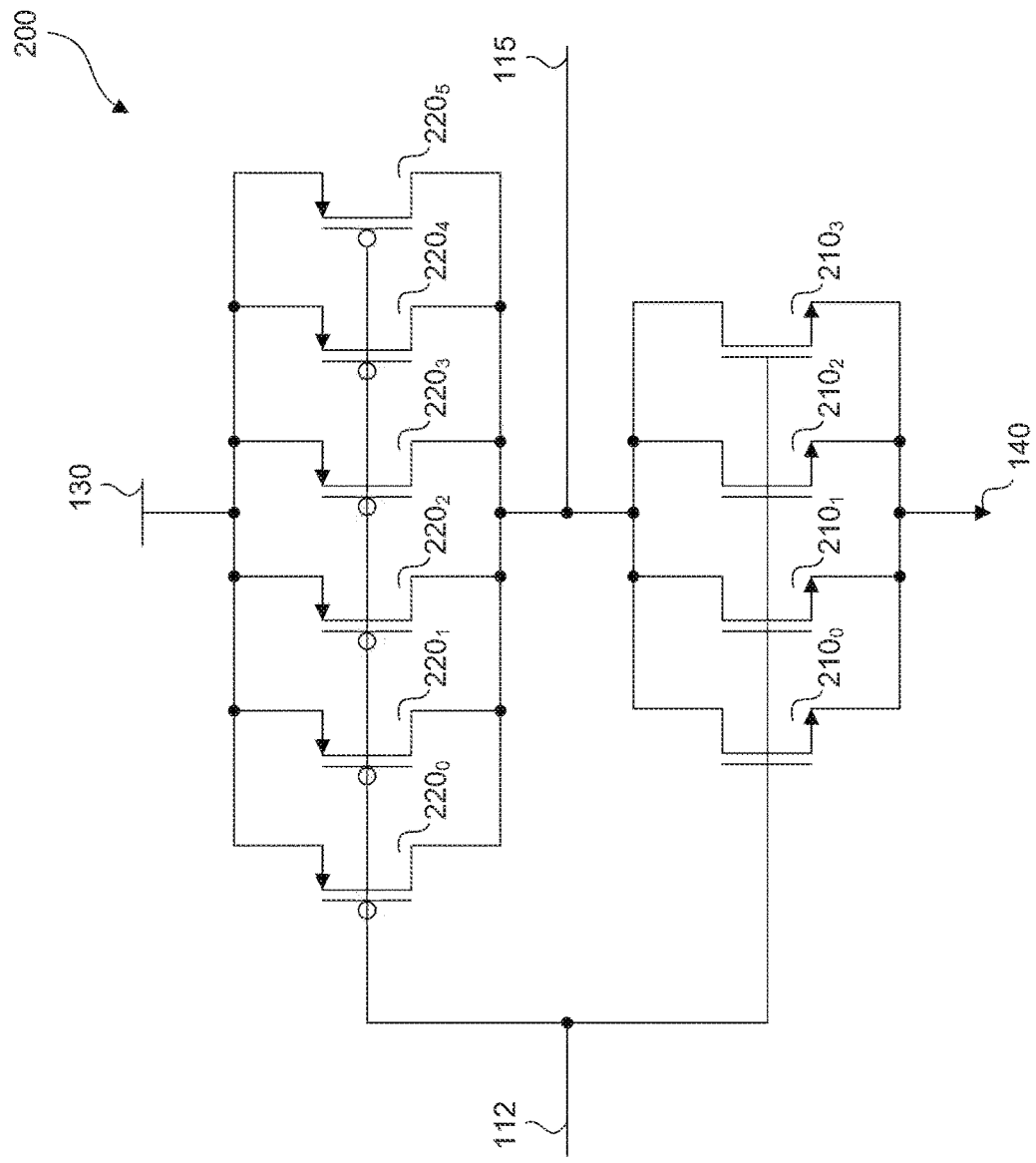

FIG. 2 is an illustration of a circuit representation of another inverter device 200, according to some embodiments. Inverter device 200 has a multi-gate transistor structure that includes n-type transistors $210_0$-$210_3$ and p-type transistors $220_0$-$220_5$. N-type transistors $210_0$-$210_3$ are electrically connected to one another in a parallel manner the transistors' drain terminals are electrically connected to one another, the transistors' source terminals are electrically connected to one another, and the transistors' gate terminals are electrically connected to one another. Similarly, p-type transistors $220_0$-$220_5$ are electrically connected to one another in a parallel manner: the transistors' drain terminals are electrically connected to one another, the transistors' source terminals are electrically connected to one another, and the transistors' gate terminals are electrically connected to one another. Inverter device 200 operates in the same manner as inverter device 100 of FIG. 1: a logic high voltage (e.g., power supply voltage 130) at input terminal 112 results in a logic low voltage (e.g., 0V) at output terminal 115—and vice versa.

In some embodiments, n-type transistors $210_0$-$210_3$ and p-type transistors are $220_0$-$220_5$ are fin field effect transistors ("finFETs"). To facilitate in the explanation of inverter device 200, finFET devices are used. The present disclosure is not limited to finFET devices and can include other types of devices such as, for example, double-gate devices, tri-gate devices, omega FETs, and gate all around devices. A person of ordinary skill in the art will recognize that, based on the disclosure herein, these other types of devices are within the spirit and scope of the present disclosure.

Figure 3:
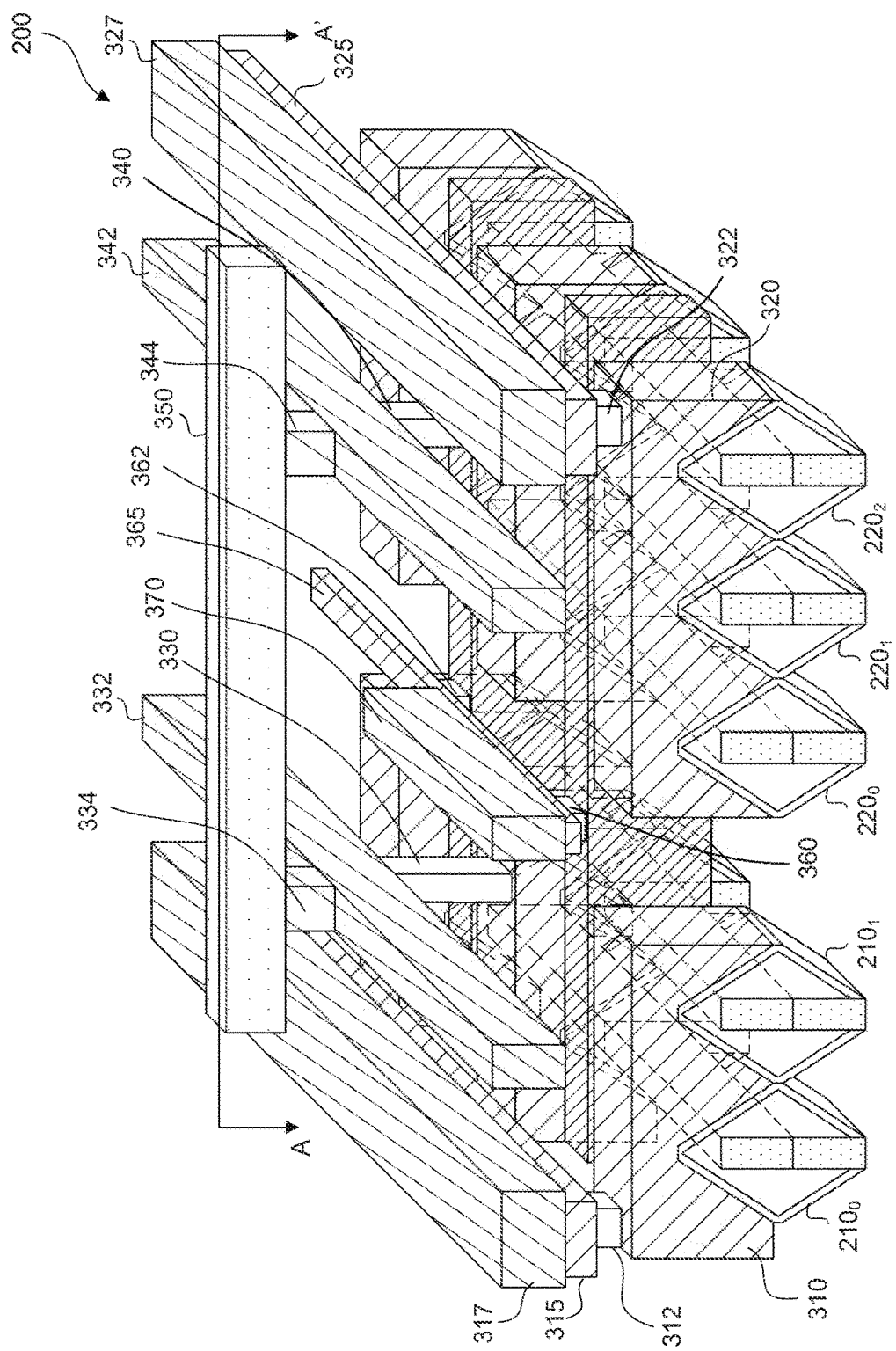
FIG. 3 is an illustration of a three-dimensional view of an inverter device, according to some embodiments.

FIG. 3 is an illustration of a three-dimensional view of inverter device 200, according to some embodiments. In FIG. 3, n-type transistors $210_0$-$210_1$ and p-type transistors $220_0$-$220_2$ are visible. N-type transistors $210_2$-$210_3$ and p-type transistors $220_3$-$220_5$ are behind n-type transistors $210_0$-$210_1$ and p-type transistors $220_0$-$220_2$, respectively.

The source terminals of n-type transistors $210_0$ and $210_1$—which are depicted as "diamond-shaped" structures in FIG. 3—are coupled (or electrically connected) to an interconnect structure 315 (also referred to herein as "reference metal line 315"). These source terminals are coupled to reference metal line 315 through a source contact 310 and a via 312. In some embodiments, via 312 and reference metal line 315 can be formed using a dual damascene interconnect process, in which a metal such as, for example, copper, ruthenium, or cobalt can be used. A person of ordinary skill in the art will recognize that other interconnect processes and metals can be used to form via 312 and reference metal line 315. Though not shown in FIG. 3, the source terminals of n-type transistors $210_2$ and $210_3$ are coupled to first reference metal line 315 in a similar manner as n-type transistors $210_0$ and $210_1$. In some embodiments, reference metal line 315 can be an electrical connection to ground (e.g., 0V) such as ground 140. An interconnect structure 317 is formed on and routed along reference metal line 315 to electrically connect ground from upper interconnect layers (not shown in FIG. 3) to reference metal line 315, according to some embodiments.

The source terminals of p-type transistors $220_0$-$220_2$—which are depicted as "diamond-shaped" structures in FIG. 3—are coupled (or electrically connected) to an interconnect structure 325 (also referred to herein as "reference metal line 325"). These source terminals are coupled to reference metal line 325 through a source contact 320 and a via 322. In some embodiments, via 322 and reference metal line 325 can be formed using a dual damascene interconnect process, in which a metal such as, for example, copper, ruthenium, or cobalt can be used. A person of ordinary skill in the art will recognize that other interconnect processes and metals can be used to form via 322 and reference metal line 325. Though not shown in FIG. 3, the source terminals of p-type transistors $220_3$-$220_5$ are coupled to reference metal line 325 in a similar manner as p-type transistors $220_0$-$220_2$. In some embodiments, second reference metal line 325 can be an electrical connection to a power supply voltage such as power supply voltage 130. An interconnect structure 327 is formed on and routed along reference metal line 325 to electrically connect the power supply voltage from upper interconnect layers (not shown in FIG. 3) to reference metal line 325, according to some embodiments.

The drain terminals of n-type transistors $210_0$-$210_3$-which are depicted as "diamond-shaped" structures in FIG. 3—are coupled (or electrically connected) to an interconnect structure 332 through a drain contact (not shown in FIG. 3) and a via 330. In some embodiments, via 330 can be formed using a single damascene interconnect process, in which a metal such as, for example, copper, ruthenium, or cobalt can be used. A person of ordinary skill in the art will recognize that other interconnect processes and metals can be used to form via 330.

The drain terminals of p-type transistors $220_0$-$220_5$—which are depicted as "diamond-shaped" structures in FIG. 3—are coupled (or electrically connected) to an interconnect structure 342 through a drain contact (not shown in FIG. 3) and a via 340. In some embodiments, via 340 can be formed using a single damascene interconnect process, in which a metal such as, for example, copper, ruthenium, or cobalt can be used. A person of ordinary skill in the art will recognize that other interconnect processes and metals can be used to form via 340. Interconnect structure 342 is coupled (or electrically connected) to interconnect structure 332 through via 344 and interconnect structure 350. Interconnect structure 350 forms an output terminal—e.g., output terminal 115—of inverter device 200. Interconnect structure 350 can be connected to upper interconnect layers (not shown in FIG. 3) to provide the output signal generated by inverter device 200 to other circuits on the same chip or off-chip.

The gate terminals of n-type transistors $210_0$-$210_3$ and p-type transistors $220_0$-$220_5$ are coupled (or electrically connected) to one another through vias 360 and 362 and a local interconnect structure 365. In some embodiments, vias 360 and 362 and local interconnect structure 365 can be formed using a dual damascene interconnect process, in which a metal such as, for example, copper, ruthenium, or cobalt can be used. A person of ordinary skill in the art will recognize that other interconnect processes and metals can be used to form vias 360 and 362 and local interconnect structure 365. An interconnect structure 370 is formed on and routed along local interconnect structure 365, according to some embodiments. Together, local interconnect structure 365 and interconnect structure 370 form an input terminal— e.g., input terminal 112—of inverter device 200. Interconnect structure 370 can be connected to upper interconnect layers (not shown in FIG. 3) to receive an input signal from other circuits on the same chip or off-chip.

In some embodiments, interconnect structure 370 has a shorter length dimension than local interconnect structure 365. The length dimension of interconnect structure 370 can be determined by layout design rules that require a minimum length of routing for interconnect structure 370—e.g., a minimum length for routing M0 metal. As would be understood by a person of ordinary skill in the art, layout design rules may vary across different semiconductor fabrication technology nodes.

A benefit, among others, of routing local interconnect structure 365 to couple the gate terminals of inverter device 200 and to route interconnect structure 370 with a shortened or minimum length dimension is improved device performance attributed to a reduction in parasitic capacitance. For example, interconnect structure 370 is routed at the same interconnect layer as interconnect structures 332 and 342 (e.g., at the M0 metal layer) and forms parasitic capacitances with these interconnect structures: (i) a parasitic capacitance between interconnect structure 370 and interconnect structure 332; and (ii) a parasitic capacitance between interconnect structure 370 and interconnect structure 342. These parasitic capacitances affect device performance by, for example, causing signal integrity issues at the input and output terminals of the inverter device due to an electrical coupling of the two terminals induced by the parasitic capacitances. A reduction in the parasitic capacitances reduces the electrical coupling, thus improving device performance.

As would be understood by a person of ordinary skill in the art, the parasitic capacitance is directly proportional to the area of the plates forming the parasitic capacitance (A)

and inversely proportional to the distance between the plates (d). This relationship can be expressed as:

$$C = \frac{\varepsilon \cdot A}{d}$$

where C is capacitance;
 ε is the dielectric constant of the material between the plates of the capacitor;
 A is the area of plates; and
 d is the distance between the plates.

As the area of the plates (A) decreases, the parasitic capacitance decreases accordingly. Also, as the distance between the plates (d) increases, parasitic capacitance decreases accordingly.

With regard to the area of the plates forming the parasitic capacitance (A), since interconnect structure 370 is shortened or at a minimum length, the area of plates forming the parasitic capacitance between interconnect structure 370 and interconnect structures 332 and 342 decreases. Also, with regard to the distance between the plates (d), since there are no interconnect structures between interconnect structure 370 and interconnect structure 332 and between interconnect structure 370 and interconnect structures, the placement of interconnect structure 370 between interconnect structure 332 and 342—e.g., placement in the middle—can be maximized. This maximized distance also decreases parasitic capacitance.

Though the above embodiments are described in context of coupling gate terminals of inverter device 200 to one another using local interconnect structure 365, based on the description herein, a person of ordinary skill in the art will recognize that a local interconnect structure—such as a structure similar to local interconnect structure 365—can be used to couple one or more drain terminals and/or one or more source terminals. Similar to the above description of local interconnect structure 365, the use of a local interconnect structure for drain and/or source terminals can achieve the benefit of reducing parasitic capacitance. The application of a local interconnect structure to drain and/or source terminals—as well as to gate terminals—is within the spirit and scope of the present disclosure.

Figure 4:
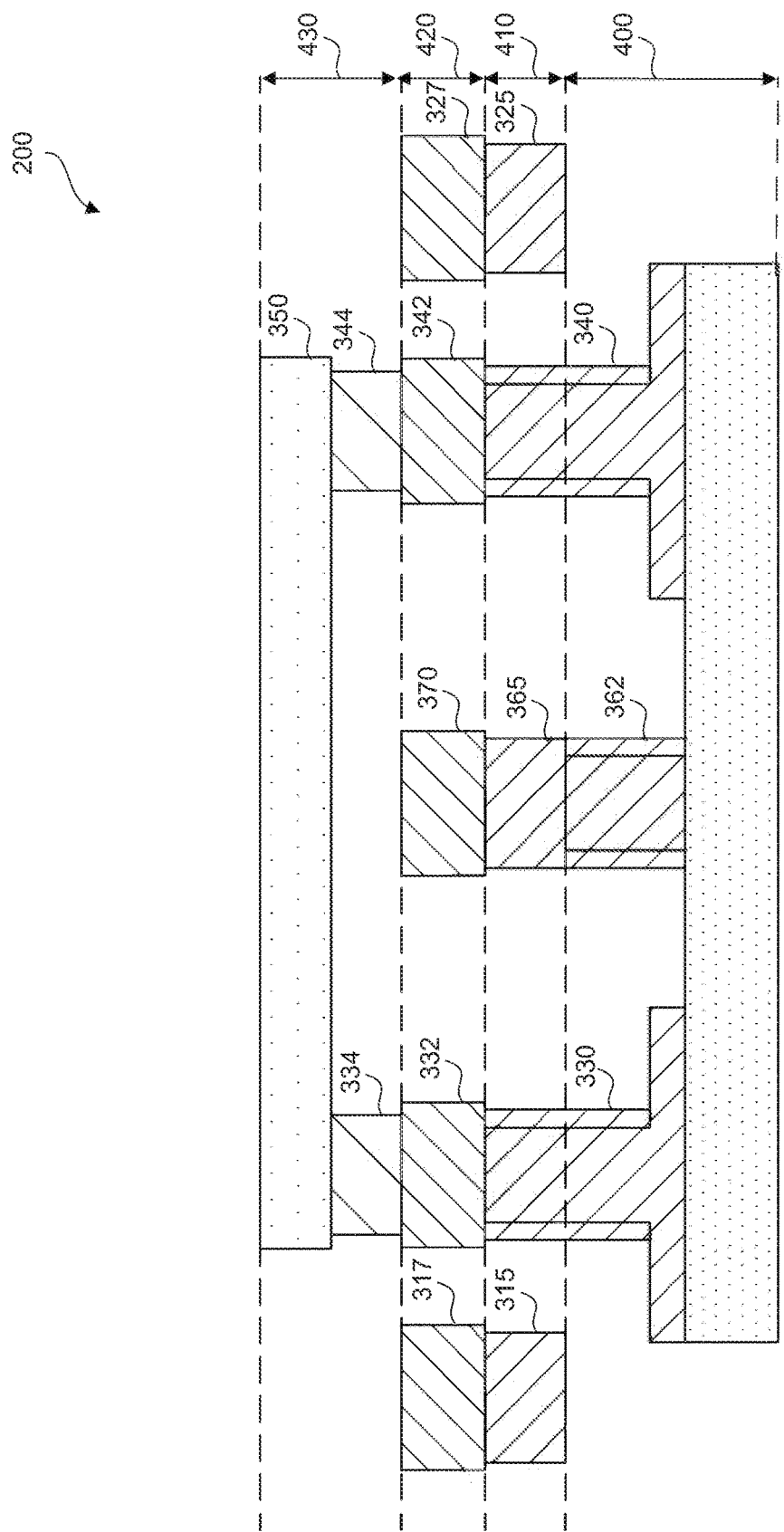
FIG. 4 is an illustration of a cross-sectional view of an inverter device, according to some embodiments.

FIG. 4 is a cross-sectional view of inverter device 200 taken from line A-A' in FIG. 3. In some embodiments, the interconnect routing can be divided into four interconnect levels: interconnect level 400, interconnect level 410, interconnect level 420, and interconnect level 430.

Interconnect level 400 can include drain contacts for n-type transistor $210_0$-$210_3$ and p-type transistors $220_0$-$220_5$. Interconnect level 400 can also include a portion of via 330, a portion of via 340, and via 362, according to some embodiments.

Interconnect level 410 can include a remaining portion of via 330, a remaining portion of via 340, reference metal line 315, reference metal line 325, and local interconnect structure 365. In some embodiments, reference metal lines 315 and 325 and local interconnect structure 365 are routed at the same interconnect level 410. In some embodiments, the same type of metal (e.g., copper, ruthenium, or cobalt) can be used to form reference metal lines 315 and 325 and local interconnect structure 365.

Interconnect level 420 can include interconnect structures 317, 327, 332, 342, and 370. These interconnect structures are routed at a M0 interconnect level, according to some embodiments. The M0 interconnect level can represent a local interconnect level used to couple (or electrically connect) adjacent devices to one another such as, for example, n-type transistors $210_0$-$210_3$ and p-type transistors $220_0$-$220_5$.

Interconnect level 430 can include vias 334 and 344 and interconnect structure 350. In some embodiments, vias 334 and 344 and interconnect structure 350 are routed at a M1 interconnect level. The M1 interconnect level can represent another local interconnect level used to couple (or electrically connect) adjacent devices to one another such as, for example, n-type transistors $210_0$-$210_3$ and p-type transistors $220_0$-$220_5$.

Figure 5:
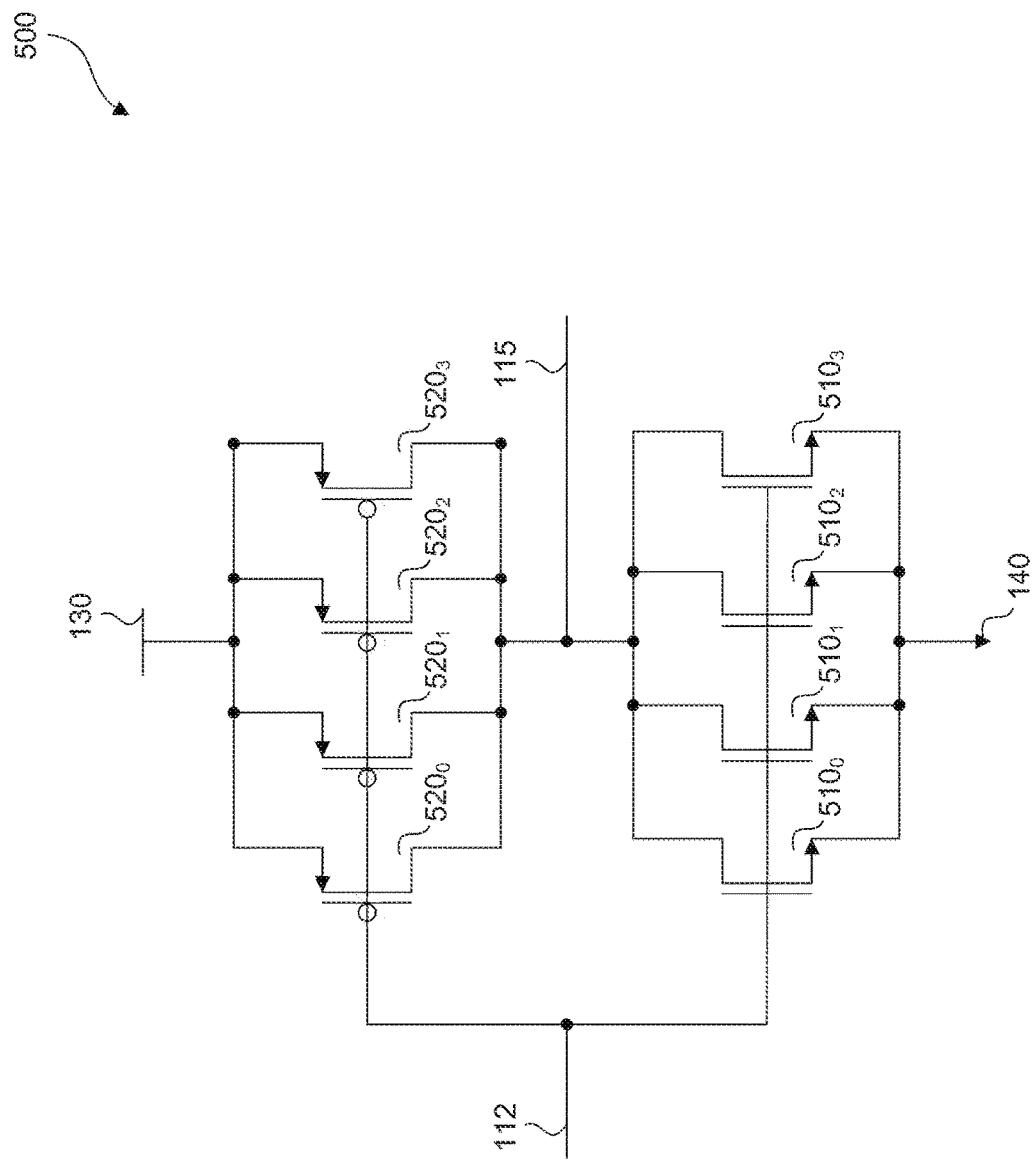
FIG. 5 is an illustration of another circuit representation of an inverter device, according to some embodiments.

FIG. 5 is an illustration of a circuit representation of an inverter device 500, according to some embodiments. Inverter device 500 has a multi-gate transistor structure that includes n-type transistors $510_0$-$510_3$ and p-type transistors $520_0$-$520_3$. N-type transistors $510_0$-$510_3$ are electrically connected to one another in a parallel manner: the transistors' drain terminals are electrically connected to one another, the transistors' source terminals are electrically connected to one another, and the transistors' gate terminals are electrically connected to one another. Similarly, p-type transistors $520_0$-$520_3$ are electrically connected to one another in a parallel manner: the transistors' drain terminals are electrically connected to one another, the transistors' source terminals are electrically connected to one another, and the transistors' gate terminals are electrically connected to one another. Inverter device 500 operates in the same manner as inverter device 100 of FIG. 1: a logic high voltage (e.g., power supply voltage 130) at input terminal 112 results in a logic low voltage (e.g., 0V) at output terminal 115—and vice versa.

In some embodiments, n-type transistors $510_0$-$510_3$ and p-type transistors $520_0$-$520_3$ are fin field effect transistors ("finFETs"). The present disclosure is not limited to finFET devices and can include other types of devices such as, for example, double-gate devices, tri-gate devices, omega FETs, and gate all around devices. A person of ordinary skill in the art will recognize that, based on the disclosure herein, other types of devices are within the spirit and scope of the present disclosure.

Figure 6:
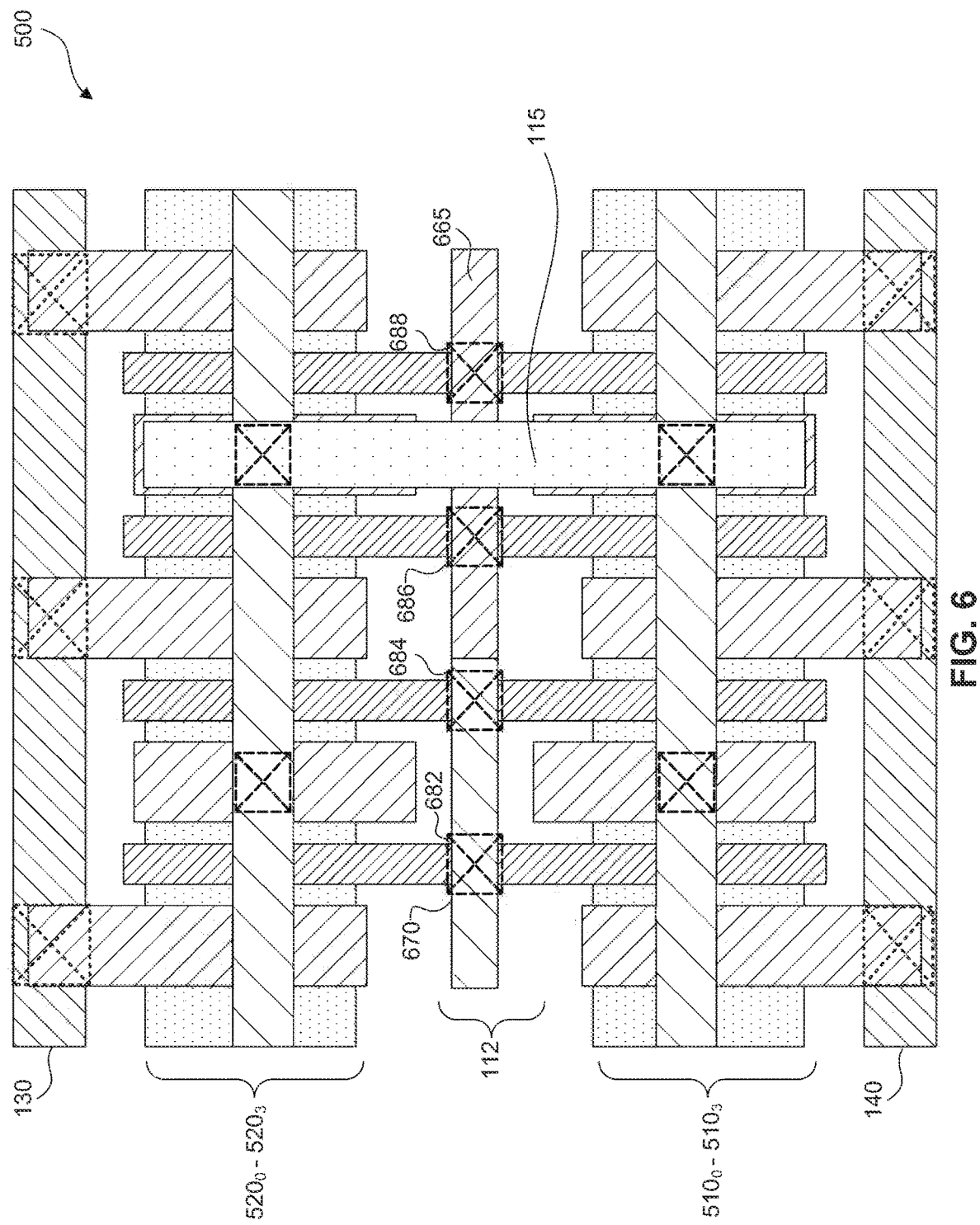
FIG. 6 is an illustration of a top-level layout view of an inverter device, according to some embodiments.

FIG. 6 is an illustration of a top-level layout view of inverter device 500, according to some embodiments. In some embodiments, input terminal 112 can be formed by a interconnect structure 670 and a local interconnect structure 665. Local interconnect structure 665 can form an electrical connection with the gate terminals of n-type transistors $510_0$-$510_3$ and p-type transistors $520_0$-$520_3$ through gate contacts 682, 684, 686, and 688. Interconnect structure 670 and local interconnect structure 665 are in physical contact with one another, thus interconnect structure 670 can couple (or electrically connect to) interconnect levels to receive a signal at input terminal 112.

Interconnect structure 670 can be routed at the same interconnect level as output terminal 115, which couples (or electrically connects) to the drain terminals of p-type transistors $520_0$-$520_3$ and the source terminals of n-type transistors $510_0$-$510_3$. Interconnect structure 670 can be routed at the M0 interconnect level, such as interconnect level 420 in FIG. 4. In some embodiments, local interconnect structure 665 can be routed at an interconnect level below interconnect structure 670, such as interconnect level 410 in FIG. 4.

In some embodiments, interconnect structure 670 has a shorter length dimension than local interconnect structure 665. For example, as shown in FIG. 6, the length of interconnect structure 670 spans across 2 gate contacts (i.e., gate contacts 682 and 684), whereas the length of local interconnect structure 665 spans across 4 gates contacts (i.e., gate contacts 682, 684, 686, and 688). The length dimension of interconnect structure 670 can be determined by layout design rules that require a minimum length of routing for interconnect structure 670—e.g., a minimum length for routing M0 metal. As would be understood by a person of ordinary skill in the art, layout design rules may vary across different semiconductor fabrication technology nodes. A benefit, among others, of routing interconnect structure 665 to couple the gate terminals of inverter device 500 and to route interconnect structure 670 with a shortened or minimum length dimension is improved device performance attributed to a reduction in parasitic capacitance.

The present disclosure is not limited to inverter devices but is also applicable to other types of logic devices, such as NAND and NOR logic devices. Embodiments of the NAND and NOR devices are described below. Though the present disclosure describes inverter, NAND, and NOR devices, other logic devices are within the spirit and scope of the present disclosure.

Figure 7:
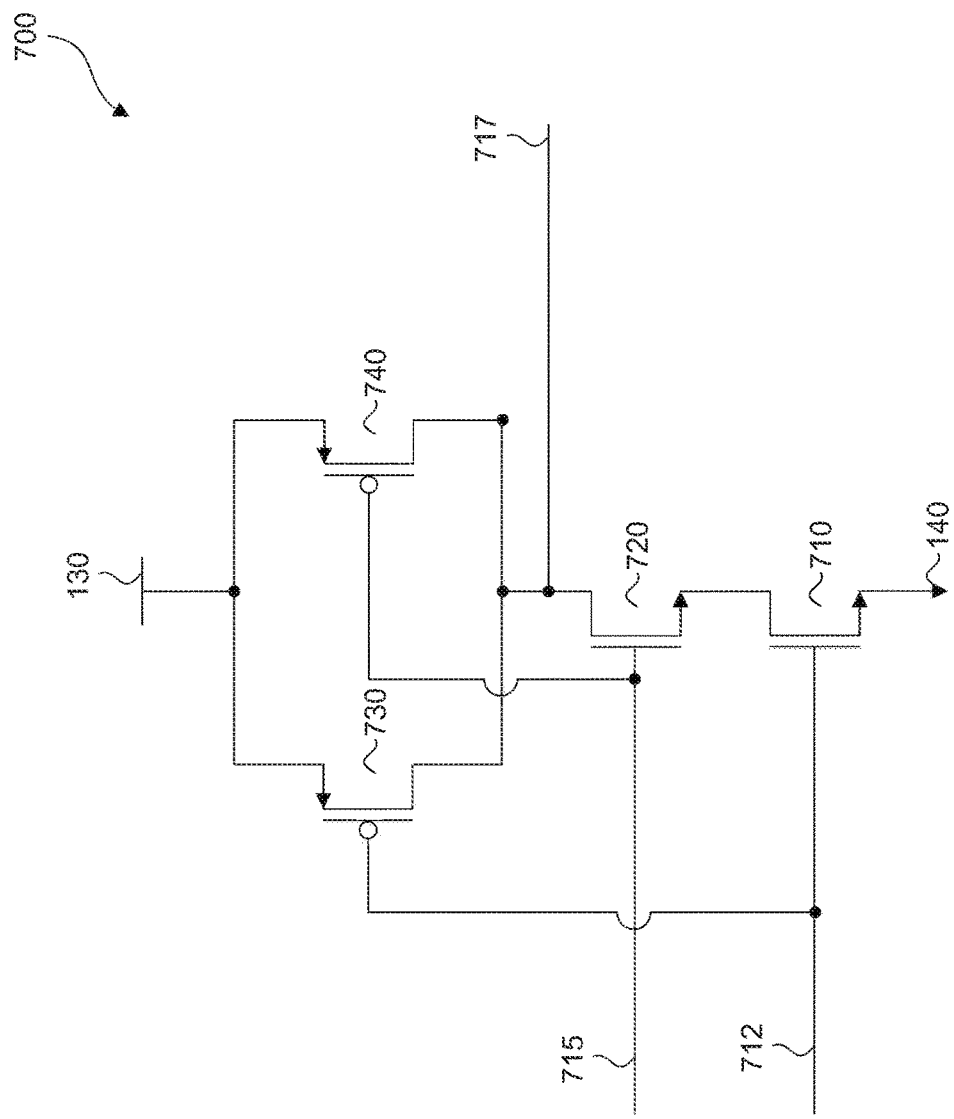
FIGS. 7 and 8 are illustrations of a circuit representation of a NAND device, according to some embodiments.

FIG. 7 is an illustration of a circuit representation of a NAND device 700, according to some embodiments. NAND device 700 includes n-type transistors 710 and 720 and p-type transistors 730 and 740. Gate terminals of n-type transistor 710 and p-type transistor 730 are electrically connected to an input terminal 712. Gate terminals of n-type transistor 720 and p-type transistor 740 are electrically connected to an input terminal 715. Further, drain terminals of n-type transistor 720 and p-type transistors 730 and 740 are electrically connected to an output terminal 717. Source terminals of p-type transistors 730 and 740 are electrically connected to power supply voltage 130. A source terminal of n-type transistor 710 is electrically connected to ground 140 (e.g., 0V). NAND device 700 operates in the following manner: (i) a logic low voltage (e.g., 0V) at both input terminals 712 and 715 results in a logic high voltage (e.g., power supply voltage 130) at output terminal 717; (ii) a logic low voltage at input terminal 712 and a logic high voltage at input terminal 715 result in a logic high voltage at output terminal 717; (iii) a logic high voltage at input terminal 712 and a logic low voltage at input terminal 715 result in a logic high voltage at output terminal 717; and (iv) a logic high voltage at both input terminals 712 and 715 results in a logic low voltage at output terminal 717.

Figure 8:
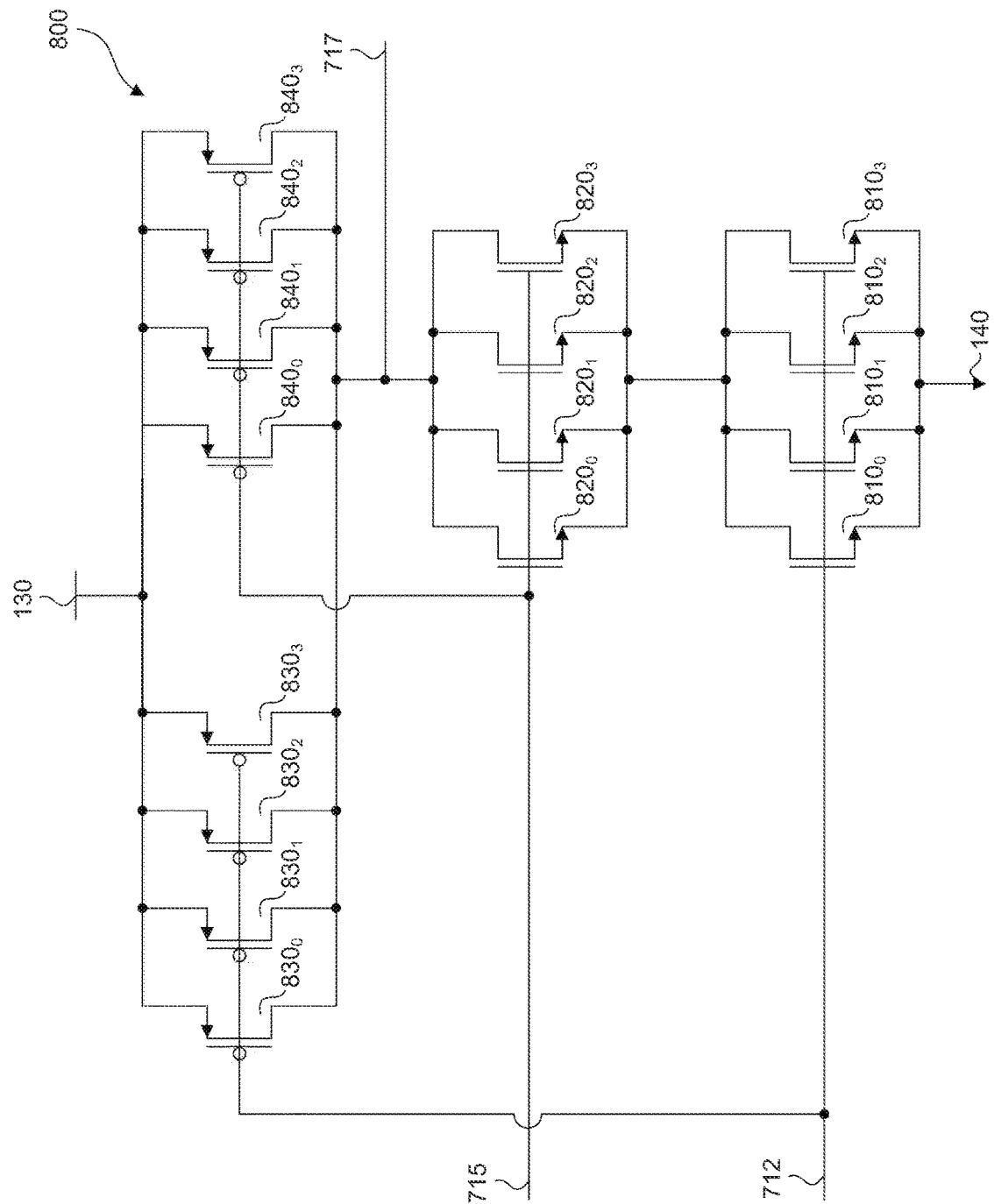

FIG. 8 is an illustration of a circuit representation of another NAND device 800, according to some embodiments. NAND device 800 has a multi-gate transistor structure that includes n-type transistors $810_0$-$810_3$ and $820_0$-$820_3$ and p-type transistors $830_0$-$830_3$ and $840_0$-$840_3$. Source terminals of n-type transistors $810_0$-$810_3$ are electrically connected to ground 140 (e.g. 0V) and drain terminals of n-type transistors $810_0$-$810_3$ are electrically connected to source terminals of n-type transistors $820_0$-$820_3$. Drain terminals of n-type transistors $820_0$-$820_3$ are electrically connected to drain terminals of p-type transistors $830_0$-$830_3$ and $840_0$-$840_3$. Further, source terminals of p-type transistors $830_0$-$830_3$ and $840_0$-$840_3$ are electrically connected to power supply voltage 130.

Gate terminals of n-type transistors $810_0$-$810_3$ and p-type transistors $830_0$-$830_3$ are electrically connected to input terminal 712. Gate terminals of n-type transistors $820_0$-$820_3$ and p-type transistors $840_0$-$840_3$ are electrically connected to input terminal 715. NAND device 800 operates in the same manner as NAND device 700 of FIG. 7. In some embodiments, n-type transistors $810_0$-$810_3$ and $820_0$-$820_3$ and p-type transistors are $830_0$-$830_3$ and $840_0$-$840_3$ are fin field effect transistors ("finFETs"). The present disclosure is not limited to finFET devices and can include other types of devices such as, for example, double-gate devices, tri-gate devices, omega FETs, and gate all around devices. A person of ordinary skill in the art will recognize that, based on the disclosure herein, these other types of devices are within the spirit and scope of the present disclosure.

Figure 9:
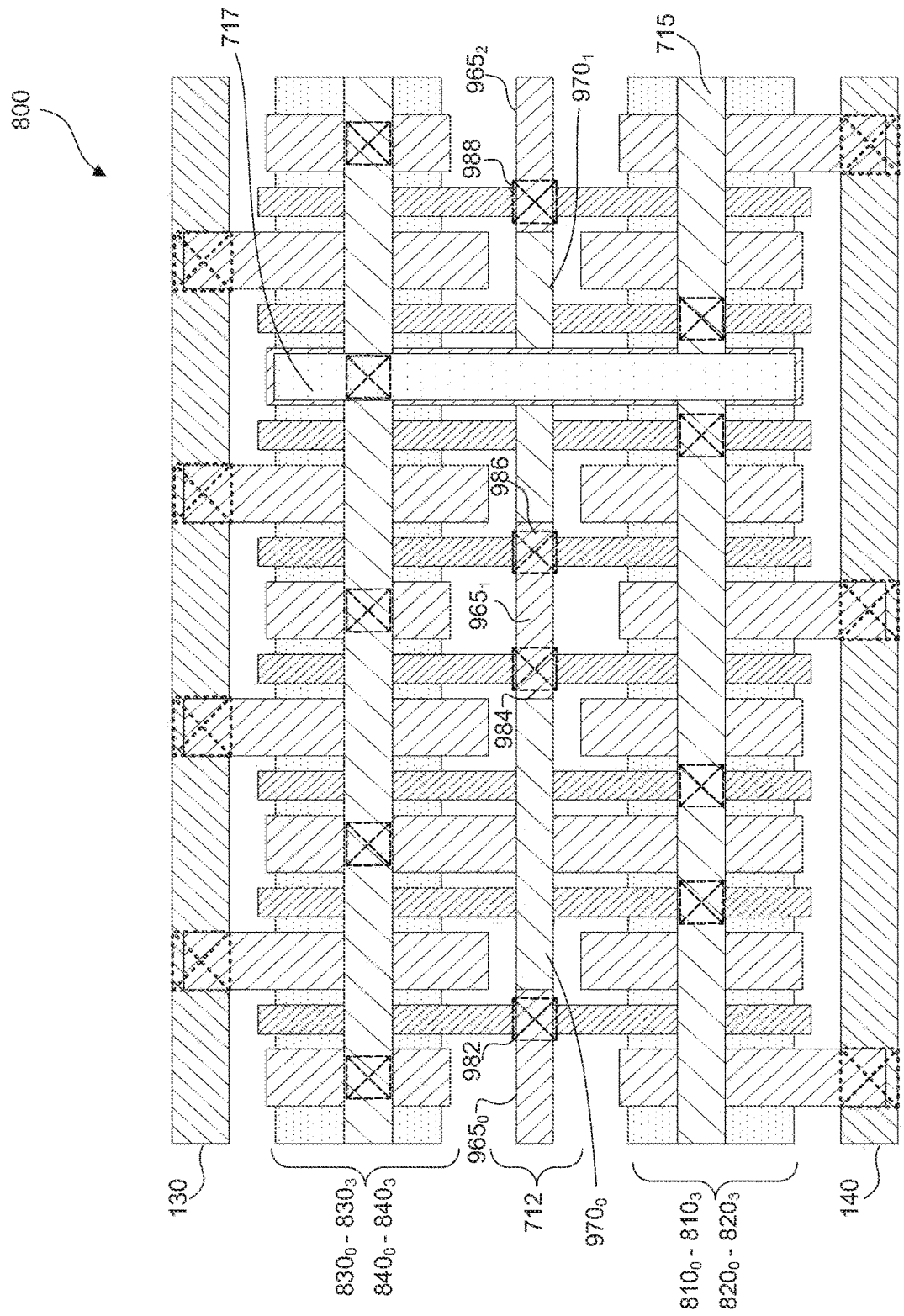
FIG. 9 is an illustration of a top-level layout view of a NAND device, according to some embodiments.

FIG. 9 is an illustration of a top-level layout view of NAND device 800, according to some embodiments. In some embodiments, input terminal 712 can be formed by interconnect structures $970_0$-$970_1$ and local interconnect structures $965_0$-$965_2$. Local interconnect structures $965_0$-$965_2$ can form an electrical connection with the gate terminals of n-type transistors $810_0$-$810_3$ and p-type transistors $830_0$-$830_3$ through gate contacts 982, 984, 986, and 988. Interconnect structure $970_0$ and local interconnect structures $965_0$-$965_1$ are in physical contact with one another, and interconnect structure $970_1$ is in physical contact with local interconnect structures $965_1$ and $965_2$, thus interconnect structures $970_0$-$970_1$ can couple (or electrically connect to) interconnect levels to receive a signal at input terminal 712. Though not shown in FIG. 9, input terminal 715 can be arranged in a similar manner as input terminal 712.

Interconnect structures $970_0$-$970_1$ can be routed at the same interconnect level as output terminal 717, which couples (or electrically connects) to the drain terminals of p-type transistors $830_0$-$830_3$ and $840_0$-$840_3$ and the drain terminals of n-type transistors $820_0$-$820_3$. Interconnect structures $970_0$-$970_1$ can be routed at the M0 interconnect level, such as interconnect level 420 in FIG. 4. In some embodiments, local interconnect structures $965_0$-$965_2$ can be routed at an interconnect level below interconnect structures $970_0$-$970_1$, such as interconnect level 410 in FIG. 4.

In some embodiments, interconnect structure 970—e.g., combination of interconnect structures $970_0$ and $970_1$-does not span across gate contacts 982, 984, 986, and 988. As shown in FIG. 9, interconnect structure 970 is separated into shorter interconnect portions by local interconnect structures $965_0$-$965_2$ to form interconnect structures $970_0$-$970_1$. A benefit, among others, of forming shorter interconnect structures $970_0$-$970_1$ is improved device performance attributed to a reduction in parasitic capacitance.

Figure 10:
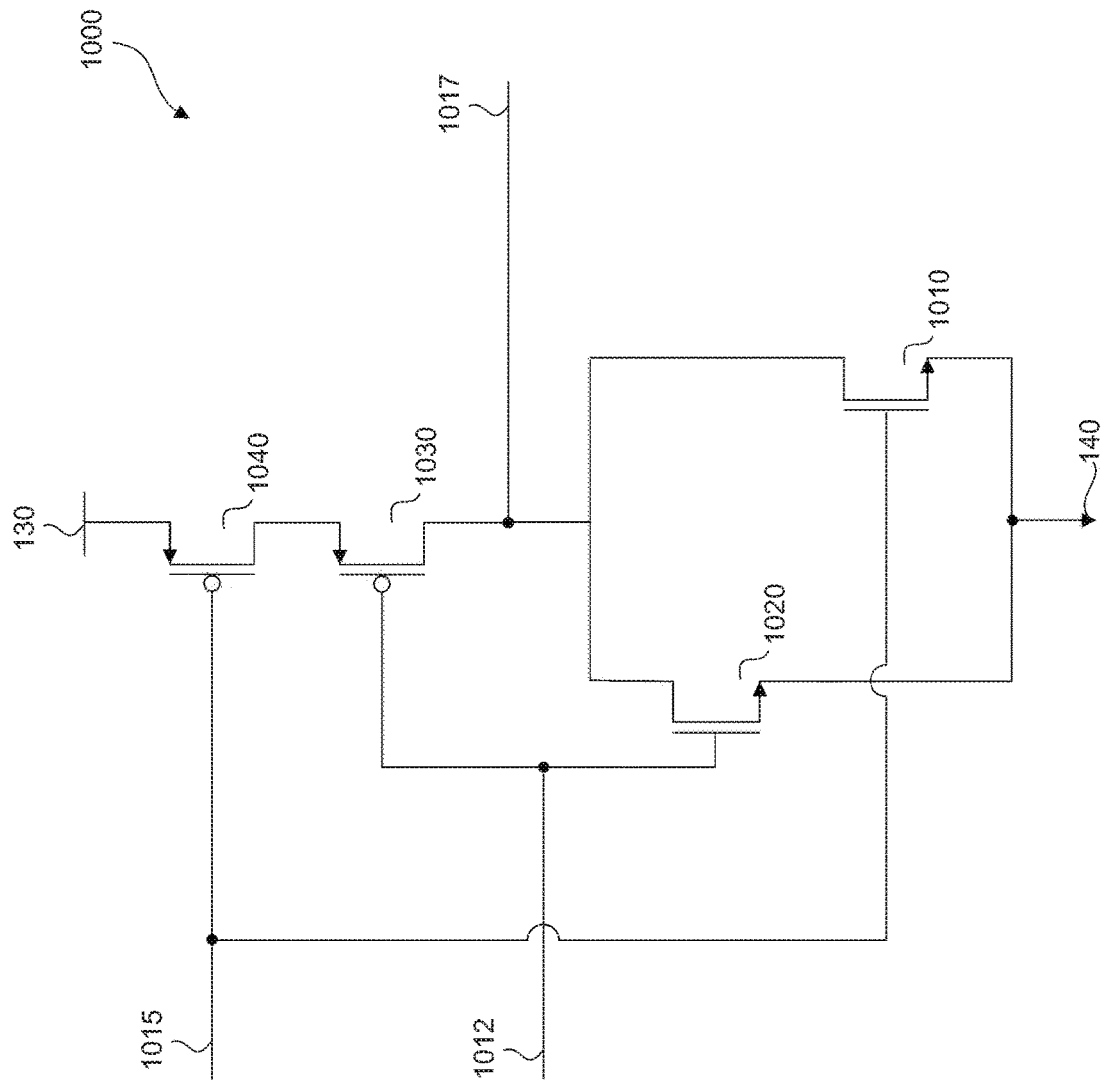
FIGS. 10 and 11 are illustrations of a circuit representation of a NOR device, according to some embodiments.

FIG. 10 is an illustration of a circuit representation of a NOR device 1000, according to some embodiments. NOR device 1000 includes n-type transistors 1010 and 1020 and p-type transistors 1030 and 1040. Gate terminals of n-type transistor 1010 and p-type transistor 1040 are electrically connected to an input terminal 1015. Gate terminals of n-type transistor 1020 and p-type transistor 1030 are electrically connected to an input terminal 1012. Further, drain terminals of n-type transistors 1010 and 1020 and p-type transistor 1030 are electrically connected to an output terminal 1017. A source terminal of p-type transistor 1040 is electrically connected to power supply voltage 130. Source terminals of n-type transistors 1010 and 1020 are electrically connected to ground 140 (e.g., 0V). NOR device 1000 operates in the following manner: (i) a logic low voltage (e.g., 0V) at both input terminals 1012 and 1015 results in a logic high voltage (e.g., power supply voltage 130) at output terminal 1017; (ii) a logic low voltage at input terminal 1012 and a logic high voltage at input terminal 1015 result in a logic low voltage at output terminal 1017; (iii) a logic high voltage at input terminal 1012 and a logic low voltage at input terminal 1015 result in a logic low voltage at output terminal 1017; and (iv) a logic high voltage at both input terminals 1012 and 1015 results in a logic low voltage at output terminal 1017.

Figure 11:
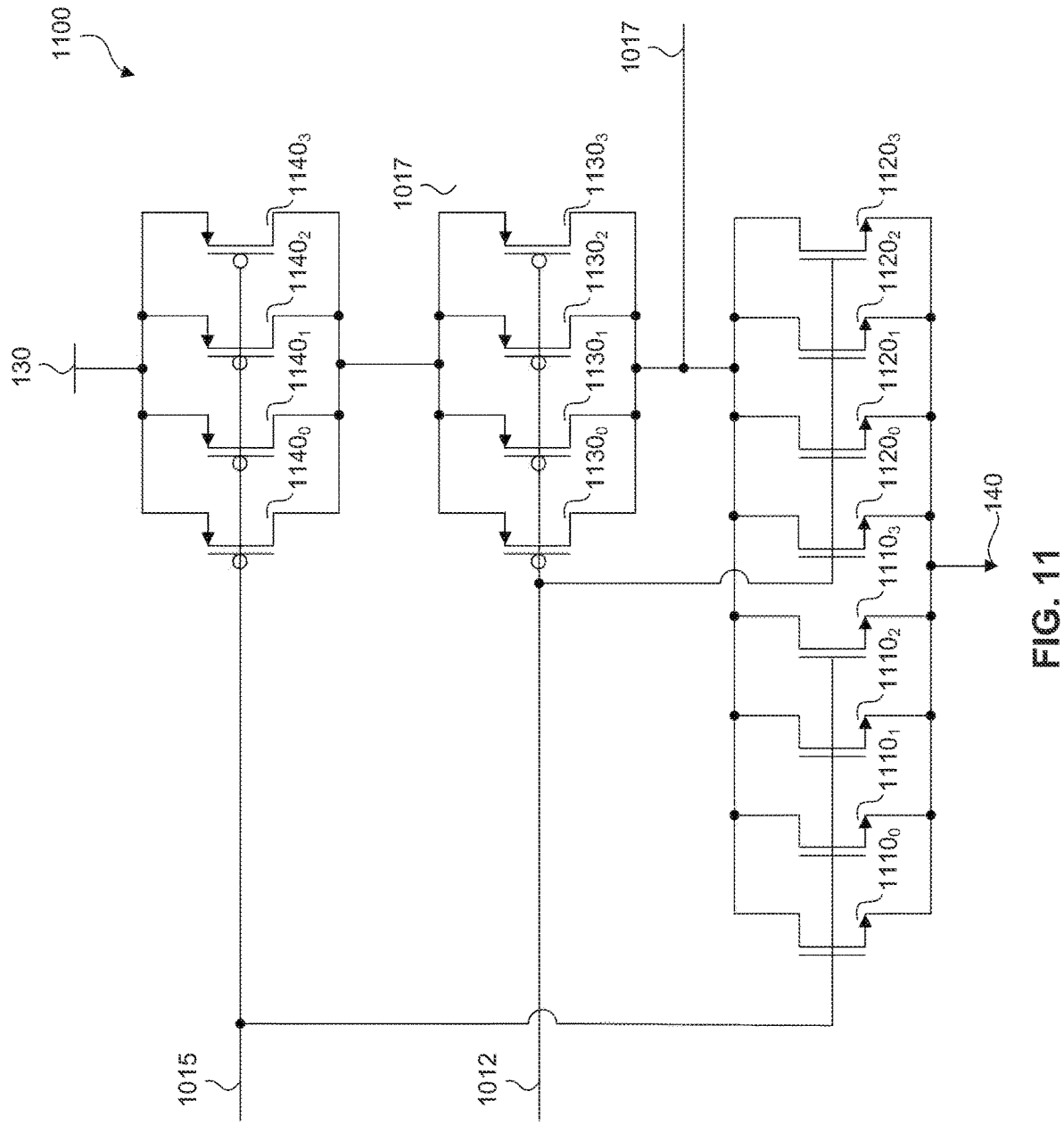

FIG. 11 is an illustration of a circuit representation of another NOR device 1100, according to some embodiments. NOR device 1100 has a multi-gate transistor structure that includes n-type transistors $1110_0$-$1110_3$ and $1120_0$-$1120_3$ and p-type transistors $1130_0$-$1130_3$ and $1140_0$-$1140_3$. Source terminals of n-type transistors $1110_0$-$1110_3$ and $1120_0$-$1120_3$ are electrically connected to ground 140 (e.g. 0V) and drain terminals of n-type transistors $1110_0$-$1110_3$ and $1120_0$-$1120_3$ are electrically connected to drain terminals of p-type transistors $1130_0$-$1130_3$. Source terminals of p-type transistors $1130_0$-$1130_3$ are electrically connected to drain terminals of p-type transistors $1140_0$-$1140_3$. Further, source terminals of p-type transistors $1140_0$-$1140_3$ are electrically connected to power supply voltage 130.

Gate terminals of n-type transistors $1110_0$-$1110_3$ and p-type transistors $1140_0$-$1140_3$ are electrically connected to input terminal 1015. Gate terminals of n-type transistors $1120_0$-$1120_3$ and p-type transistors $1130_0$-$1130_3$ are electrically connected to input terminal 1112. NOR device 1100 operates in the same manner as NOR device 1000 of FIG. 10. In some embodiments, n-type transistors $1110_0$-$1110_3$ and $1120_0$-$1120_3$ and p-type transistors are $1130_0$-$1130_3$ and $1140_0$-$1140_3$ are fin field effect transistors ("finFETs"). The present disclosure is not limited to finFET devices and can include other types of devices such as, for example, double-gate devices, tri-gate devices, omega FETs, and gate all around devices. A person of ordinary skill in the art will recognize that, based on the disclosure herein, these other types of devices are within the spirit and scope of the present disclosure.

Figure 12:
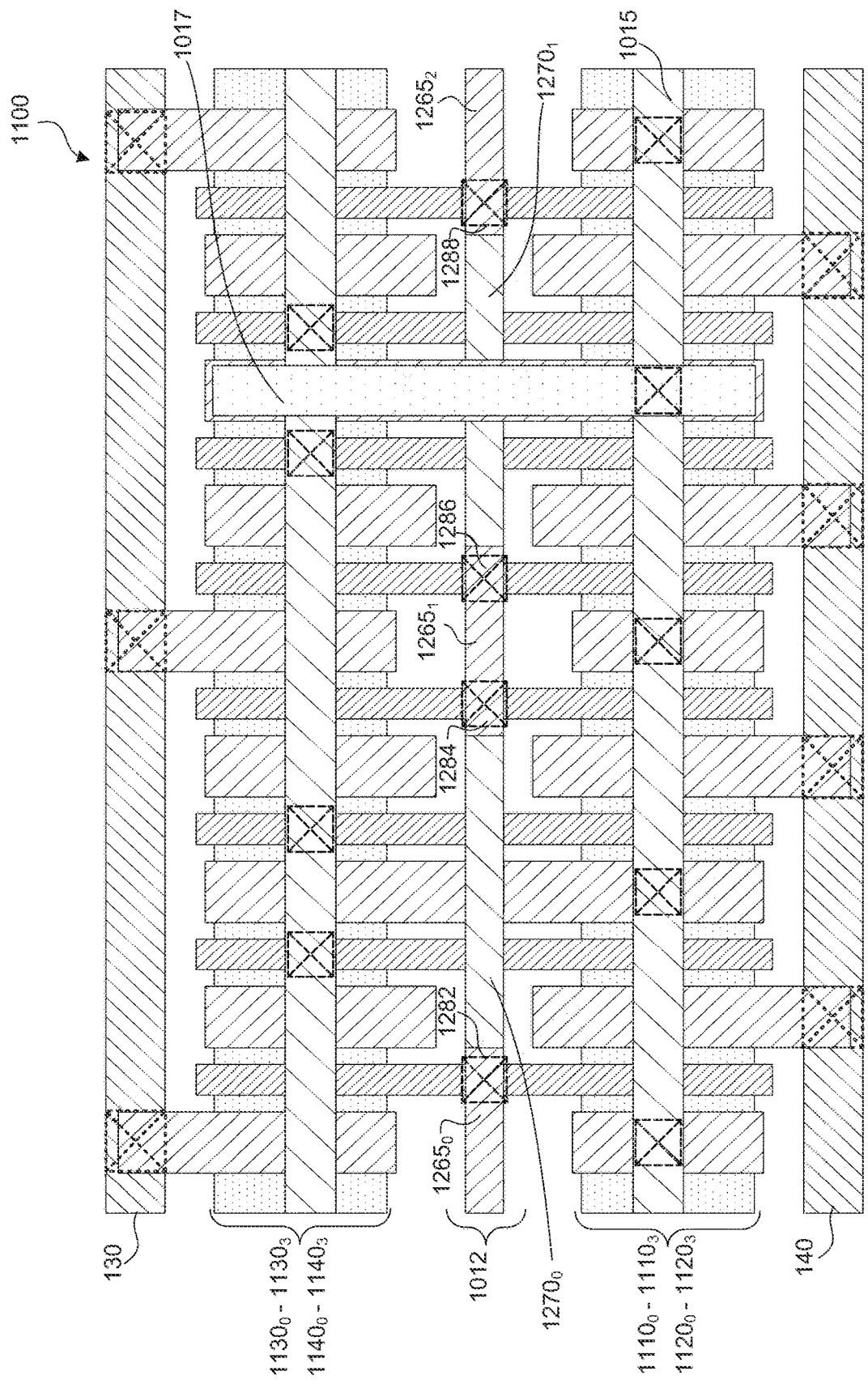
FIG. 12 is an illustration of a top-level layout view of a NOR device, according to some embodiments.

FIG. 12 is an illustration of a top-level layout view of NOR device 1100, according to some embodiments. In some embodiments, input terminal 1012 can be formed by interconnect structures $1270_0$-$1270_1$ and local interconnect structures $1265_0$-$1265_2$. Local interconnect structures $1265_0$-$1265_2$ can form an electrical connection with the gate terminals of n-type transistors $1120_0$-$1120_3$ and p-type transistors $1130_0$-$1130_3$ through gate contacts 1282, 1284, 1286, and 1288. Interconnect structure $1270_0$ and local interconnect structures $1265_0$-$1265_1$ are in physical contact with one another, and interconnect structure $1270_1$ is in physical contact with local interconnect structures $1265_1$ and $1265_2$, thus interconnect structures $1270_0$-$1270_1$ can couple (or electrically connect to) interconnect levels to receive a signal at input terminal 1012. Though not shown in FIG. 12, input terminal 1015 can be arranged in a similar manner as input terminal 1012.

Interconnect structures $1270_0$-$1270_1$ can be routed at the same interconnect level as output terminal 1017, which couples (or electrically connects) to the drain terminals of p-type transistors $1130_0$-$1130_3$ and the drain terminals of n-type transistors $1110_0$-$1110_3$ and $1120_0$-$1120_3$. Interconnect structures $1270_0$-$1270_1$ can be routed at the M0 interconnect level, such as interconnect level 420 in FIG. 4. In some embodiments, local interconnect structures $1265_0$-$1265_2$ can be routed at an interconnect level below interconnect structures $1270_0$-$1270_1$, such as interconnect level 410 in FIG. 4.

In some embodiments, interconnect structure 1270—e.g., combination of interconnect structures $1270_0$ and $1270_1$—does not span across gate contacts 1282, 1284, 1286, and 1288. As shown in FIG. 12, interconnect structure 1270 is separated into shorter interconnect portions by local interconnect structures $1265_0$-$1265_2$ to form interconnect structures $1270_0$-$1270_1$. A benefit, among others, of forming shorter interconnect structures $1270_0$-$1270_1$ is improved device performance attributed to a reduction in parasitic capacitance.

Figure 13:
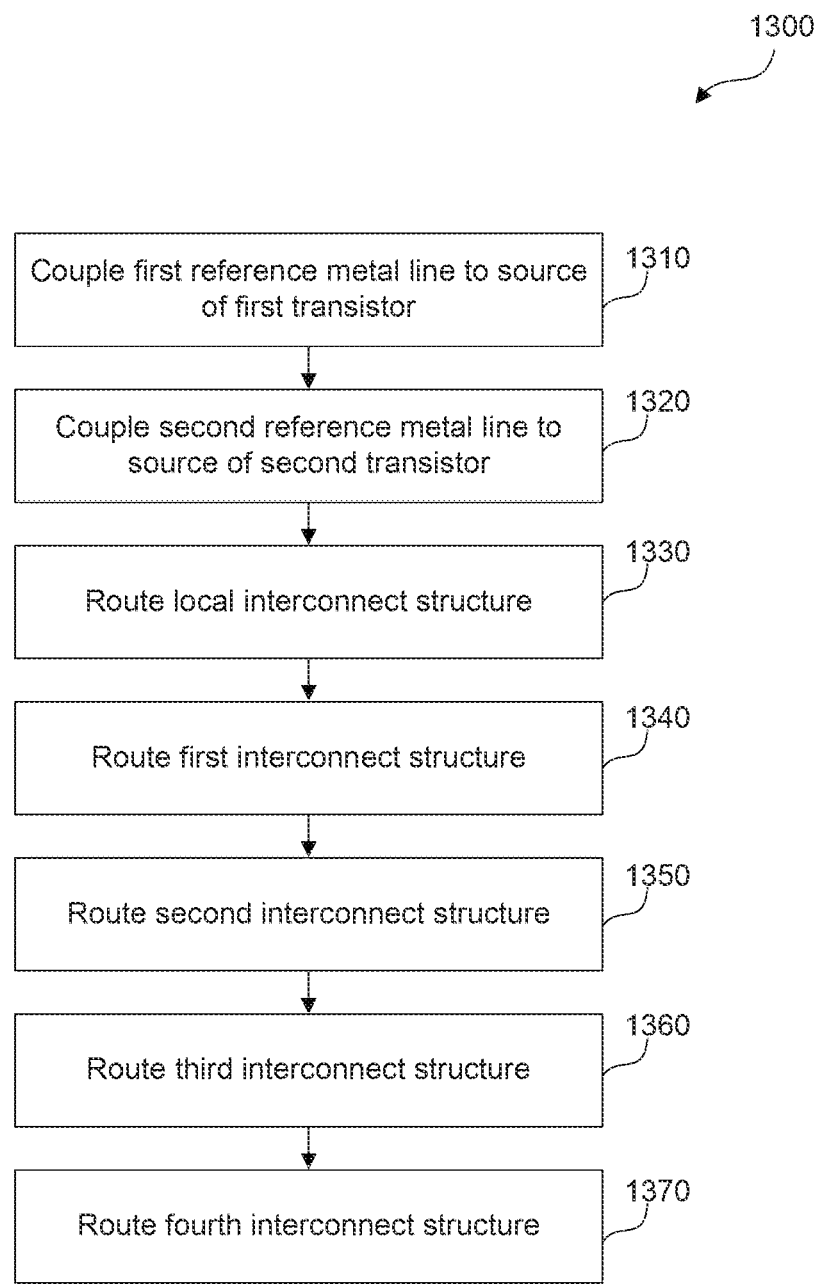
FIG. 13 is an illustration of a method for interconnect routing for a logic device, according to some embodiments.

FIG. 13 is an illustration of a method 1300 for interconnect routing for a logic device, according to some embodiments. The operations depicted in method 1300 can be performed by, for example, an electronic design automation (EDA) tool that operates on a computer system, such as an example computer system 1400 described below with respect to FIG. 14. For explanation purposes, the operations shown in method 1300 are described in context of the inverter devices illustrated in FIGS. 1-6. Based on the disclosure herein, a person of ordinary skill in the art will recognize that method 1300 is applicable to other logic devices, such as AND, OR, XOR, NAND, NOR, and XNOR logic devices. Further, other operations in method 1300 are possible, and the operations can be performed in a different order and/or vary.

At operation 1310, a first reference metal line is coupled to a first source of a first transistor. The first transistor includes a first gate, the first source, and a first drain. In some embodiments, the first reference metal line can be reference metal line 315 in FIG. 3, which can be coupled (or electrically connected) to ground. In some embodiments, the first source of the first transistor can be the combined source terminal formed by n-type transistors $210_0$-$210_3$ in FIG. 2. N-type transistors $210_0$-$210_3$ includes a combined gate terminal (e.g., the first gate), a combined source terminal (e.g., the first source), and a combined drain terminal (e.g., the first drain).

At operation 1320, a second reference metal line is coupled to a second source of a second transistor. The second transistor includes a second gate, the second source, and a second drain. In some embodiments, the second reference metal line can be reference metal line 325 in FIG. 3, which can be coupled (or electrically connected) to a power supply voltage. In some embodiments, the second source of the second transistor can be the combined source terminal of p-type transistors $220_0$-$220_5$ in FIG. 2. P-type transistors $220_0$-$220_5$ includes a combined gate terminal (e.g., the second gate), a combined source terminal (e.g., the second source), and a combined drain terminal (e.g., the second drain).

At operation 1330, a local interconnect structure is routed at a same interconnect level as the first and second reference metal lines and coupled to the first and second gates. In some embodiments, the local interconnect structure can be local interconnect structure 365 in FIG. 3. As shown in FIG. 4, local interconnect structure 365 can be at the same interconnect level as reference metal line 315 (e.g., the first reference metal line) and reference metal line 325 (e.g., the second reference metal line). Further, as shown in FIG. 3, local interconnect structure 365 is coupled to gate terminals of n-type transistors $210_0$-$210_3$ and p-type transistors $220_0$-$220_5$ through vias 360 and 362.

At operation 1340, a first interconnect structure is routed above the local interconnect structure and coupled to the first drain. In some embodiments, the first interconnect structure can be interconnect structure 332, which is coupled to the combined drain terminal of n-type transistors $210_0$-$210_3$, as shown in FIG. 3. Further, as shown in FIG. 3, interconnect structure 332 is routed above local interconnect structure 365 (e.g., the local interconnect structure).

At operation 1350, a second interconnect structure is routed above the local interconnect structure and coupled to the second drain. In some embodiments, the second interconnect structure can be interconnect structure 342, which is coupled to the combined drain terminal of p-type transistors $220_0$-$220_5$, as shown in FIG. 3. Further, as shown in FIG. 4, interconnect structure 342 is routed above local interconnect structure 365 (e.g., the local interconnect structure).

At operation 1360, a third interconnect structure is routed at a same interconnect level as the first and second interconnect structures and on the local interconnect structure. In some embodiments, the third interconnect structure can be interconnect structure 370 in FIG. 3. As shown in FIG. 3, interconnect structure 370 (e.g., the third interconnect structure) is routed on and along local interconnect structure 365 (e.g., the local interconnect structure). Interconnect structure 370 is routed over the combined gate terminal of n-type transistors $110_0$-$110_3$ and the combined gate terminal of p-type transistors $220_0$-$220_5$, according to some embodiments. Further, FIG. 4 shows that interconnect structure 370 is routed on local interconnect structure 365 (e.g., the local interconnect structure) and at the same interconnect level as interconnect structure 332 (e.g., the first interconnect structure) and interconnect structure 342 (e.g., the second interconnect structure). In some embodiments, interconnect structure 370 (e.g., the third interconnect structure) has a shorter length dimension than local interconnect structure 365 (e.g., the local interconnect structure).

At operation 1370, a fourth interconnect structure is routed above the first, second, and third interconnect structures and coupled to the first and second interconnect structures. In some embodiments, the fourth interconnect structure can be interconnect structure 350 in FIG. 3. FIG. 4 shows interconnect structure 350 is routed above interconnect structures 332, 342, and 370 (e.g., the first, second, and third interconnect structures, respectively) and coupled to interconnect structures 332 and 342 (e.g., the first and second interconnect structures, respectively) through vias 334 and 344, respectively.

One or more of the above operations described in FIG. 13 can be used to manufacture lithographic photomasks or photoreticles (also referred to herein as "reticles"), each with a predefined pattern to be used in the fabrication of an integrated circuit. The photomask or reticle can be an opaque plate with holes or transparencies that allow light to shine through the predefined pattern. The predefined pattern can be based on, for example, the layout views described above with respect to FIGS. 6, 9, and 12. For example, when integrated circuit layout design is completed, the data associated with the layout design can be translated to an industry-standard format (e.g., GDSII stream format or another type of database file format). An integrated circuit manufacturer (e.g., a semiconductor foundry) can convert the industry-standard translated data into another data format used to generate the photomasks or reticles.

To fabricate one or more layers of the integrated circuit based on the predefined patterns, in a sequential manner, the photomasks or reticles can be placed in a photolithography stepper or scanner and selected for light exposure. The patterns on the photomasks or reticles can be projected and shrunk onto a surface of a wafer (e.g., semiconductor substrate). With further fabrication processing—such as the deposition of an interconnect material, one or more etching processes, and other related fabrication operations—a portion of the integrated circuit based on the predefined patterns (e.g., layout views described above with respect to FIGS. 6, 9, and 12) can be fabricated.

Figure 14:
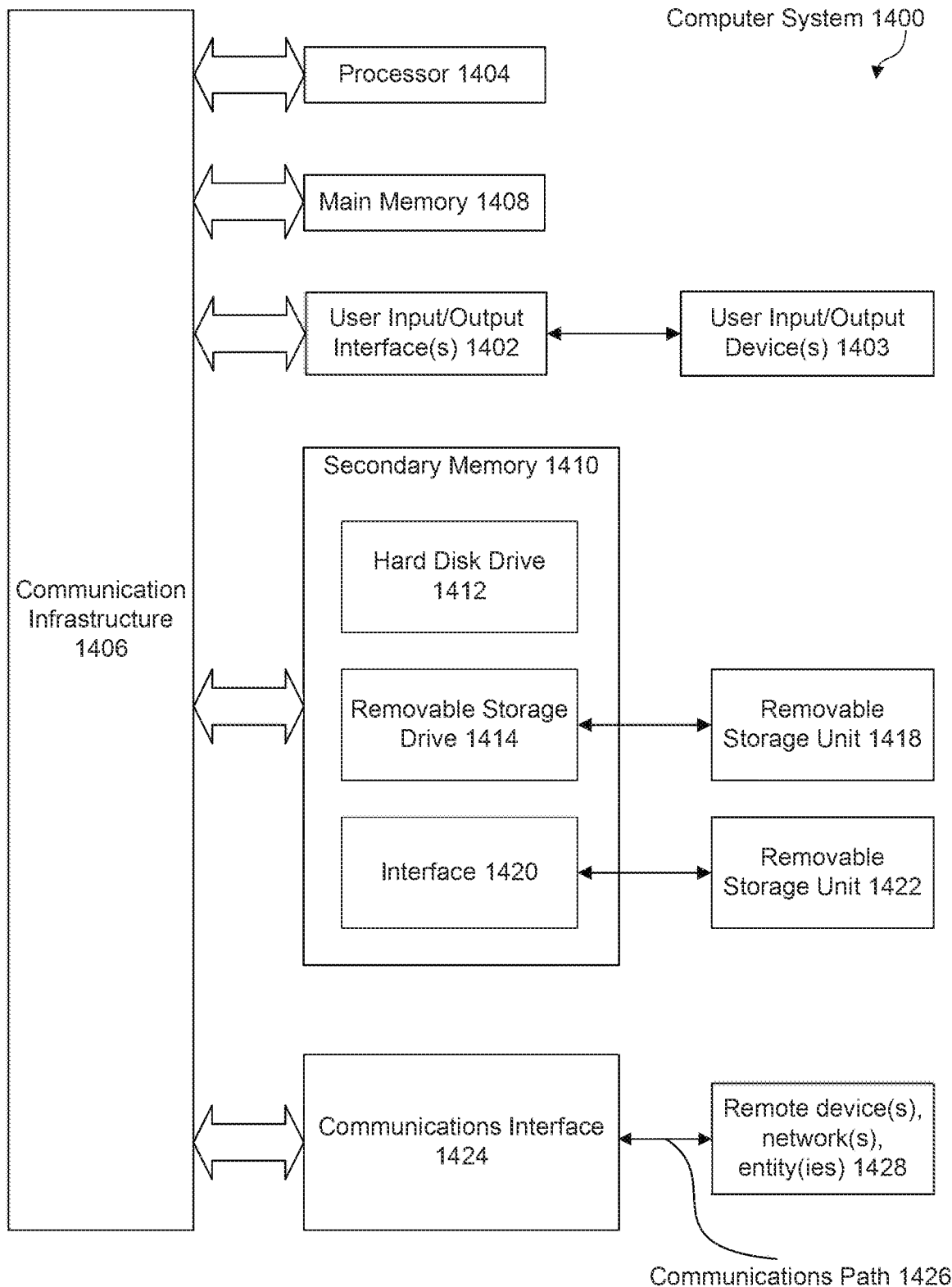
FIG. 14 is an illustration of an example computer system in which various embodiments of the present disclosure can be implemented, according to some embodiments of the present disclosure.

FIG. 14 is an illustration of an example computer system 1400 in which various embodiments of the present disclosure can be implemented, according to some embodiments. Computer system 1400 can be any well-known computer capable of performing the functions and operations described herein. For example, and without limitation, computer system 1400 can be capable of routing interconnects for a logic device using, for example, an EDA tool. Computer system 1400 can be used, for example, to execute one or more operations in method 1300, which describes an example method for interconnect routing for a logic device.

For example, the EDA tool can generate a graphics database system (GDS) file, which can be used to generate photomasks for fabricating one or more logic circuits (or any other type of circuit) and associated interconnects. In some embodiments, a circuit layout included in the GDS file can be read and transferred onto a quartz or glass substrate to form opaque patterns that correspond to the circuit layout and associated interconnects. In some embodiments, various processing tools (e.g., photolithography equipment, deposition equipment, and etching equipment) can be used to fabricate the circuits and associated interconnects on a substrate.

Computer system 1400 includes one or more processors (also called central processing units, or CPUs), such as a processor 1404. Processor 1404 is connected to a communication infrastructure or bus 1406. Computer system 1400 also includes input/output device(s) 1403, such as monitors, keyboards, pointing devices, etc., that communicate with communication infrastructure or bus 1406 through input/output interface(s) 1402. An EDA tool can receive instructions to implement functions and operations described herein—e.g., method 1300 of FIG. 13—via input/output device(s) 1403. Computer system 1400 also includes a main or primary memory 1408, such as random access memory (RAM). Main memory 1408 can include one or more levels of cache. Main memory 1408 has stored therein control logic (e.g., computer software) and/or data. In some embodiments, the control logic (e.g., computer software) and/or data can include one or more of the operations described above with respect to method 1300 of FIG. 13.

Computer system 1400 can also include one or more secondary storage devices or memory 1410. Secondary memory 1410 can include, for example, a hard disk drive 1412 and/or a removable storage device or drive 1414. Removable storage drive 1414 can be a floppy disk drive, a magnetic tape drive, a compact disk drive, an optical storage device, tape backup device, and/or any other storage device/drive.

Removable storage drive 1414 can interact with a removable storage unit 1418. Removable storage unit 1418 includes a computer usable or readable storage device having stored thereon computer software (control logic) and/or data. Removable storage unit 1418 can be a floppy disk, magnetic tape, compact disk, DVD, optical storage disk, and/any other computer data storage device. Removable storage drive 1414 reads from and/or writes to removable storage unit 1418 in a well-known manner.

According to some embodiments, secondary memory 1410 can include other means, instrumentalities or other approaches for allowing computer programs and/or other instructions and/or data to be accessed by computer system 1400. Such means, instrumentalities or other approaches can include, for example, a removable storage unit 1422 and an interface 1420. Examples of the removable storage unit 1422 and the interface 1420 can include a program cartridge and cartridge interface (such as that found in video game devices), a removable memory chip (such as an EPROM or PROM) and associated socket, a memory stick and USB port, a memory card and associated memory card slot, and/or any other removable storage unit and associated interface. In some embodiments, secondary memory 1410, removable storage unit 1418, and/or removable storage unit 1422 can include one or more of the operations described above with respect to method 1300 of FIG. 13.

Computer system 1400 can further include a communication or network interface 1424. Communication interface 1424 enables computer system 1400 to communicate and interact with any combination of remote devices, remote networks, remote entities, etc. (individually and collectively referenced by reference number 1428). For example, communication interface 1424 can allow computer system 1400 to communicate with remote devices 1428 over communications path 1426, which can be wired and/or wireless, and which can include any combination of LANs, WANs, the Internet, etc. Control logic and/or data can be transmitted to and from computer system 1400 via communication path 1426.

The operations in the preceding embodiments can be implemented in a wide variety of configurations and architectures. Therefore, some or all of the operations in the preceding embodiments—e.g., method 1300 of FIG. 13—can be performed in hardware, in software or both. In some embodiments, a tangible apparatus or article of manufacture comprising a tangible computer useable or readable medium having control logic (software) stored thereon is also referred to herein as a computer program product or program storage device. This includes, but is not limited to, computer system 1400, main memory 1408, secondary memory 1410 and removable storage units 1418 and 1422, as well as tangible articles of manufacture embodying any combination of the foregoing. Such control logic, when executed by one or more data processing devices (such as computer system 1400), causes such data processing devices to operate as described herein.

The present disclosure describes routing a local interconnect structure to one or more gate terminals, one or more drain terminals, and/or one or more source terminals of a transistor device (e.g., finFET devices, double-gate devices, tri-gate devices, omega FETs, and gate all around devices). A benefit, among others, of routing the local interconnect structure to the gate, drain, and/or source terminals is to reduce one or more parasitic capacitances in an interconnect level (e.g., in an M0 interconnect level). By routing to the gate, drain, and/or source terminals using the local interconnect structure, a length dimension of an interconnect in the interconnect level can be shortened or minimized. This shortened or minimum interconnect length reduces parasitic capacitances present at the interconnect level, thus improving device performance. From a layout perspective, the local interconnect structure can be routed at an interconnect level below metal M0, such as at an interconnect level associated with a reference metal line (e.g., reference metal lines 315 and 325 of FIGS. 3 and 4).

In some embodiments, an apparatus of the present disclosure includes a transistor, a local interconnect structure, a first interconnect structure, and a second interconnect structure. The transistor includes a gate terminal, a first source/drain terminal coupled to a reference metal line, and a second source/drain terminal. The local interconnect structure is coupled to the gate terminal and routed at a same interconnect level as the reference metal line. The first interconnect structure is coupled to the second source/drain terminal and routed above the local interconnect structure. The second interconnect structure is routed above the local interconnect structure and at a same interconnect level as the first interconnect structure.

In some embodiments, a method of the present disclosure includes four operations. First, a reference metal line is coupled to a first source/drain terminal of a transistor having a gate terminal, the first source/drain terminal, and a second source/drain terminal. Second, a local interconnect structure is routed at a same interconnect level as the reference metal line to couple to the gate terminal. Third, a first interconnect structure is routed above the local interconnect structure to couple to the second source/drain terminal. Fourth, a second interconnect structure is routed at a same interconnect level as the first interconnect structure and above the local interconnect structure.

In some embodiments, another apparatus of the present disclosure includes a first fin field effect transistor (finFET), a second finFET, a local interconnect structure, a first interconnect structure, a second interconnect structure, and a third interconnect structure. The first finFET includes a first gate terminal, a first source/drain terminal connected to a first reference metal line through a first via, and a second source/drain terminal. The second finFET with a second gate terminal, a third source/drain terminal connected to a second reference metal line through a second via, and a fourth source/drain terminal. The local interconnect structure is connected to the first and second gate terminals through one or more third vias and routed at a same interconnect level as the first and second reference metal lines. The first interconnect structure is connected to the second source/drain terminal through the fourth via and the first reference metal line and routed above the local interconnect structure. The second interconnect structure is connected to the fourth source/drain terminal through the fifth via and the second reference metal line and routed above the local interconnect structure. The third interconnect structure is routed above the local interconnect structure and at a same interconnect level as the first and second interconnect structures.

It is to be appreciated that the Detailed Description section, and not the Abstract of the Disclosure, is intended to be used to interpret the claims. The Abstract of the Disclosure section may set forth one or more but not all exemplary embodiments contemplated and thus, are not intended to be limiting to the subjoined claims.

The foregoing disclosure outlines features of several embodiments so that those skilled in the art may better understand the aspects of the present disclosure. Those skilled in the art will appreciate that they may readily use the present disclosure as a basis for designing or modifying other processes and structures for carrying out the same purposes and/or achieving the same advantages of the embodiments introduced herein. Those skilled in the art will also realize that such equivalent constructions do not depart from the spirit and scope of the present disclosure, and that they may make various changes, substitutions, and alterations herein without departing from the spirit and scope of the subjoined claims.

What is claimed is:

1. A method, comprising:
routing a reference metal line to couple to a first source/drain terminal of a transistor with a gate terminal, the first source/drain terminal, and a second source/drain terminal;
routing, at a same interconnect level as the reference metal line, a local interconnect structure to couple to the gate terminal of the transistor and to an other gate terminal of an other transistor;
routing, above an interconnect level of the local interconnect structure, a first interconnect structure to couple to the second source/drain terminal; and routing, above the interconnect level of the local interconnect structure and at a same interconnect level as the first interconnect structure, a second interconnect structure.

2. The method of claim 1, further comprising:
routing an other reference metal line to couple to a third source/drain terminal of the other transistor having the other gate terminal, the third source/drain terminal, and a fourth source/drain terminal;
routing a third interconnect structure above the local interconnect structure to couple to the third source/drain terminal, wherein the third interconnect structure is at the same interconnect level as the first and second interconnect structures; and
routing a fourth interconnect structure above the first, second, and third interconnect structures to couple to the first and third interconnect structures.

3. The method of claim 2, further comprising:
routing the reference metal line to couple to ground; and
routing the other reference metal line to couple to a power supply voltage.

4. The method of claim 2, wherein routing the other reference metal line comprises routing the other reference metal line to couple to a power supply voltage.

5. The method of claim 1, wherein routing the reference metal line comprises routing the reference metal line to couple to ground.

6. The method of claim 1, wherein routing the local interconnect structure comprises routing the local interconnect structure at a longer length than that of the second interconnect structure.

7. The method of claim 1, wherein routing the local interconnect structure comprises routing the local interconnect structure made of cobalt, copper, or ruthenium.

8. A method, comprising:
coupling a first reference metal line to a first/source drain terminal of a first transistor with a first gate terminal, the first source/drain terminal, and a second source/drain terminal;
coupling a second reference metal line to a third source/drain terminal of a second transistor with a second gate terminal, the third source/drain terminal, and a fourth source/drain terminal;
coupling, at a same interconnect level as the first and second reference metal lines, a local interconnect structure to the first and second gate terminals;
coupling, above an interconnect level of the local interconnect structure, a first interconnect structure to the second source/drain terminal;
coupling, above the interconnect level of the local interconnect structure, a second interconnect structure to the third source/drain terminal; and
routing, above the interconnect level of the local interconnect structure and at a same interconnect level as the first and second interconnect structures, a third interconnect structure.

9. The method of claim 8, further comprising:
coupling a fourth interconnect structure to the first and second interconnect structures, wherein the fourth interconnect structure is routed above an interconnect level of the first, second, and third interconnect structures.

10. The method of claim 8, wherein coupling the first reference metal line comprises routing the first reference metal line to couple to ground.

11. The method of claim 10, wherein coupling the second reference metal line comprises routing the second reference metal line to couple to a power supply voltage.

12. The method of claim 8, wherein coupling the local interconnect structure comprises routing the local interconnect structure at a longer length than that of the third interconnect structure.

13. The method of claim 8, wherein coupling the local interconnect structure comprises routing the local interconnect structure made of cobalt, copper, or ruthenium.

14. The method of claim 8, wherein coupling the local interconnect structure comprises routing the local interconnect structure over the first and second gate terminals, wherein the third interconnect structure is routed over the first or second gate terminal.

15. A method, comprising:
routing a first reference metal line to couple to a first source/drain terminal of a first fin field effect transistor (finFET) with a first gate terminal, the first source/drain terminal, and a second source/drain terminal;
routing a second reference metal line to couple to a third source/drain terminal of a second finFET with a second gate terminal, the third source/drain terminal, and a fourth source/drain terminal;
routing a local interconnect structure to the first and second gate terminals;
routing, through the first reference metal line, a first interconnect structure to the second source/drain terminal;
routing, through the second reference metal line, a second interconnect structure to the third source/drain terminal;
routing, at a same interconnect level as the first and second interconnect structures, a third interconnect structure,
wherein the local interconnect structure, the first reference metal line, and the second reference metal line are routed at a first interconnect level, and
wherein the first interconnect structure, the second interconnect structure, and the third interconnect structure are routed at a second interconnect level.

16. The method of claim 15, further comprising:
routing a fourth interconnect structure to couple to the first and second interconnect structures.

17. The method of claim 15, wherein routing the first reference metal line comprises routing the first reference metal line to couple to ground.

18. The method of claim 15, wherein routing the second reference metal line comprises routing the second reference metal line to couple to a power supply voltage.

19. The method of claim 15, wherein routing the local interconnect structure comprises routing the local interconnect structure at a longer length than that of the third interconnect structure.

20. The method of claim 15, wherein routing the local interconnect structure comprises routing the local interconnect structure made of cobalt, copper, or ruthenium.

\* \* \* \* \*